March 29, 1960 H. H. LENK 2,930,890

SQUELCH CIRCUIT WITH REGENERATION IN NOISE AMPLIFIER

Filed Jan. 27, 1958

INVENTOR.
HERBERT H. LENK.
BY Alden D. Redfield
Irwin P. Garfinkle
ATTORNEYS.

United States Patent Office 2,930,890

Patented Mar. 29, 1960

2,930,890

SQUELCH CIRCUIT WITH REGENERATION IN NOISE AMPLIFIER

Herbert H. Lenk, Cincinnati, Ohio, assignor to Avco Manufacturing Corporation, Cincinnati, Ohio, a corporation of Delaware Application January 27, 1958, Serial No. 711,470

10 Claims. (Cl. 250—20)

The present invention relates to a noise control circuit for radio receivers and, more particularly, to a circuit for automatically silencing radio receivers when the signal-to-noise ratio falls below a predetermined amount.

It has been known that in receivers having automatic gain control or gain-limiting devices, noise reproduction is greatly increased when the carrier or signal amplitude drops below predetermined magnitudes. In order to silence the receiver at such times so as to reduce operator fatigue, maintain military security, etc., many automatic silencing networks have been devised. This invention provides an improved, automatic silencing system or squelch circuit which operates on distributed noise in the supersonic frequency range to disable the audio frequency section of the receiver.

Briefly described, the quelch circuit employed in accordance with this invention consists of a supersonic frequency band amplifier serving to raise noise signals to a predetermined amplitude. The amplifier is stabilized to provide a positive level of operation for the circuit and to eliminate flutter. The amplified noise is then rectified by a first diode, and the recovered direct current is further amplified to supply the energizing winding of a normally closed cutout relay. The arrangement provided permits energization of the relay windings only when the current due to noise supplied to the diode exceeds a pre-set amount, and means are also included for increasing the relay-energizing currents from zero to maximum current in a very short time. When the windings are energized, the relay contacts are opened and the continuity of the signal path in the audio frequency stages of the receiver is broken in any convenient manner. For the purpose of providing fast transition from zero to maximum current flow in the relay-energizing coil, the diode rectifier is biased with a source of positive feedback by means of a uniquely arranged second diode.

A principal object of this invention is to provide an automatic squelch control giving protection against objectionable noise by sensing the level of the supersonic component of the noise.

Another object of this invention is to instantaneously disable or enable the audio frequency section of a receiver in response to the increase or decrease in noise, above or below a predetermined level of supersonic noise.

Still another object of this invention is to provide a regeneratively forward-biased rectifier for supplying direct current signals for silencing a receiver, wherein said direct current signals from said rectifier will increase to maximum conduction at a very rapid rate, and without hesitation.

Still another object of this invention is to provide a lock-in type of operation preventing erratic noise peaks from silencing the receiver and causing objectionable flutter.

A further object of this invention is to essentially equalize the average noise level required to silence the receiver with the average noise level required to unsilence the receiver.

For a more comprehensive understanding of these and other objects and advantages of this invention, reference should now be made to the following detailed description and to the accompanying drawing, in which.

Figure 3:
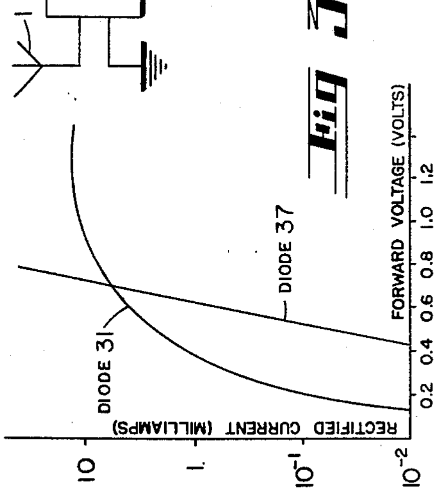

Fig. 3 presents curves illustrating typical characteristics of the diodes used in accordance with my invention.

Figure 1:
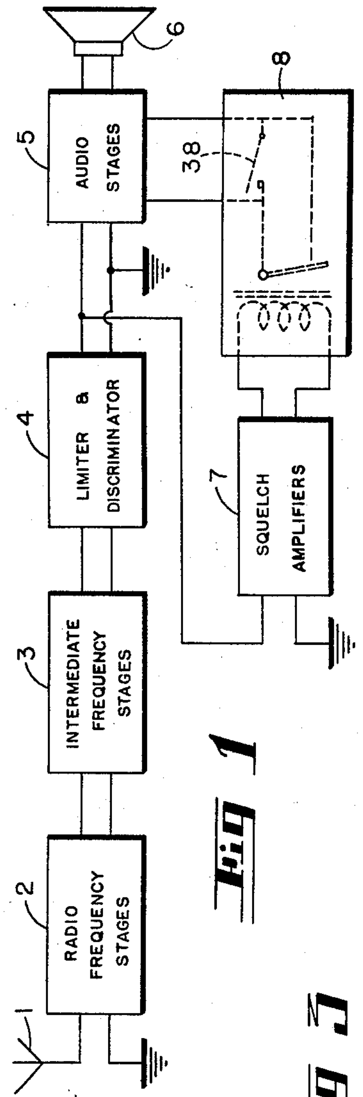
Fig. 1 is a block diagram illustrating a typical superheterodyne frequency-modulated receiver embodying my invention.

Referring to Fig. 1, there is shown a conventional frequency-modulated receiver having an antenna 1, radio frequency stages 2, intermediate frequency stagese 3, a limiter and discriminator 4, audio frequency amplifiers 5, and a loudspeaker 6. For the purposes of silencing the speaker 6 in the absence of signal, or when noise exceeds a predetermined amount, I provide my novel squelch circuit 7 designed to operate on supersonic noise, and a relay system 8. The input to the squelch circuit 7 is taken from across the limiter and discriminator 4, while the contacts of the relay 8 are connected in a disabling circuit with the audio amplifiers 5. Preferably, the characteristics of the limiter and discriminator circuit 4 are such that its input-output response is very steep, and that low amplitude noise spikes can produce a relatively large noise output for power amplification in the squelch amplifiers.

Under normal operating conditions, i.e., in the absence of noise, the contacts of the relay 8 are closed and the audio amplifiers 5 are operative; however, when the level of supersonic noise exceeds the predetermined level, the relay 8 is energized by the output from the squelch circuit 7, thereby opening the relay contacts and disabling the audio amplifiers 5. Although not shown and not a part of this invention, disabling of the audio amplifier stages 5 may be accomplished by interrupting the B+ supply of one or more of the amplifiers, or in any other convenient manner.

Figure 2:
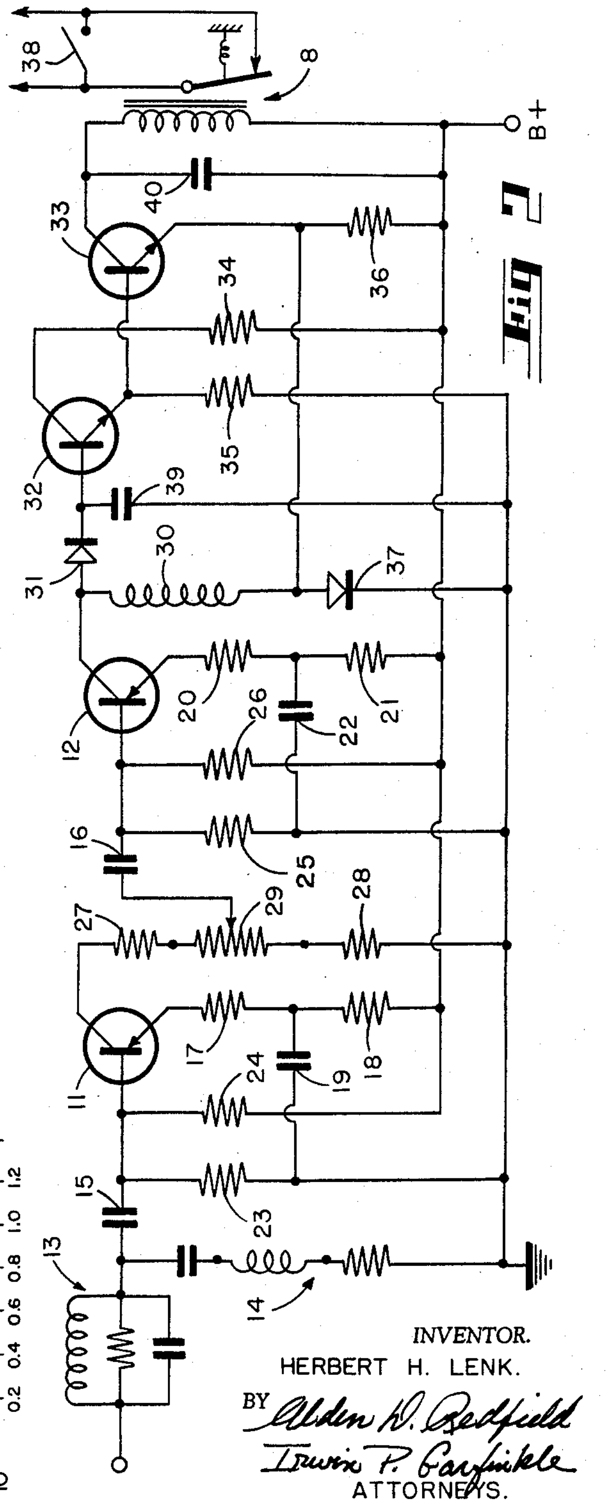
Fig. 2 is a circuit diagram illustrating my novel squelch circuit.

Referring now to Fig. 2, there is illustrated the squelch circuit 7 embodying my inventive features and the relay 8. Broadly, the illustrated squelch circuit comprises three sections, including a two-stage amplifier for supersonic noise, a rectifier network for converting amplified supersonic noise into direct current signals, and a direct current amplifier for supplying the relay.

The two-stage amplifier for supersonic noise frequencies includes junction-type PNP transistors 11 and 12, appropriately biased from a suitable B+ supply, and associated filter networks for rejecting radio frequencies and audio signals, and for selecting only noise in the range between, but not including, the receiver intermediate and audio frequencies. The filters include a parallel-resonant tank 13 and a series-resonant tank 14, both tuned to the radio frequencies to be rejected. Rejection of audio signals is achieved by means of proper selection of the condensers 15 and 16 operating in conjunction with the dynamic characteristics of the transistors 11 and 12, respectively, and by frequency-selective negative feedback.

In order to maintain at a fixed value the amount of noise required to energize the windings of the relay 8, the noise amplifiers 11 and 12 must be stabilized. This is accomplished by means of negative feedback, by suitable biasing of transistors 11 and 12 and, in addition, by operating the transistor 12 at full saturation in the absence of signal. Frequency-selective negative feedback is achieved in the emitter circuit of transistor amplifier 11 by means of resistors 17 and 18, resistor 18 being bypassed for audio frequencies by a condenser 19, and in the emitter circuit of transistor amplifier 12 by resistors 20 and 21, resistor 21 being bypassed by a condenser 22. This arrangement provides higher levels of feedback for signals in the audio frequency range and lower levels of feedback in the supersonic frequency range. The resistors 17 and 20 also serve to raise the input impedance of the transistors 11 and 12 to a level where low-loss coupling to the preceding stage is possible without the necessity of transformers.

Base-emitter bias for the transistor 11 is provided from the B+ supply through resistors 23, 24, 17 and 18, and for the transistor 12 through resistors 25, 26, 20 and 21. The coupling between the collector output of transistor 11 and the base input of transistor 12 comprises a sensitivity-control network consisting of the fixed resistors 27 and 28 and a potentiometer 29, the setting of which determines the level of noise required for operating the relay 8.

The supersonic noise output from the transistor 12 is applied across a choke 30 and then to a diode 31. As will be seen, the diode 31 serves as a detector, interstage coupler, exciter for a pulse-stretching circuit and driver for the input of the direct current amplifier. The direct current output from diode 31 is coupled to the base input of a junction-type NPN transistor 32 connected in the emitter-follower configuration, and then to the input of a second transistor amplifier 33. The electrodes of the transistor 32 are appropriately biased from the B+ supply through resistors 34 and 35, while the electrodes of transistor 33 are appropriately biased from the B+ supply through the windings of the relay 8, a resistor 36 and a diode 37.

For the purpose of disabling the effects of the squelch circuit 7 and thus permitting audio operation during all noise conditions, a single-pole, single-throw, manual switch 38 may be included in the relay 8 and, as shown, is shunted across the contacts thereof. Thus, when switch 38 is closed manually, the audio section 5 will be operative, regardless of the level of supersonic noise present.

It will be noted that the emitter circuit of transistor 33 is connected to ground through a diode 37, which is suitably biased in a forward direction from the B+ supply through the large resistor 36. As will later be more fully explained, the diode 37 provides a positive feedback circuit to forwardly bias the diode 31.

The condenser 39 in the emitter-base circuit of transistor 32 is included for the purpose of providing for the diode 31 a load having a time constant which is large enough to prevent sudden changes of noise level from changing the state of the relay 8. In addition, a condenser 40 is connected across the windings of relay 8 to prevent operation of the relay 8 on erratic noises.

As previously noted, the squelch circuit is designed so that in the absence of noise, or when the noise is below a predetermined level, the signals applied to the transistor amplifiers 11 and 12 will be insufficient, after rectification by the diode 31, to cause conduction in the output circuits of transistors 32 and 33; and, hence, the windings of the relay 8 will not be energized. When the noise exceeds the predetermined level, then the output from the limiter and discriminator 4, when amplified in the transistors 11 and 12, will be sufficient to cause the necessary amount of conduction through diode 31 to cause energization of the relay windings.

The output from the limiter and discriminator 4 may contain components of the radio frequency carrier, audio frequency signal, and all ranges of noise frequencies. Radio frequency components are removed by means of the parallel-resonant tank 13 and the series-resonant tank 14 which are tuned to intermediate frequency range. Audio components are removed from the transistor amplifier 11 by condenser 15 operating in conjunction with the input impedance of transistor 11 and by the frequency-selective negative feedback network, which includes the emitter-resistors 17 and 18 and the condenser 19. Similarly, audio components are removed from the transistor amplifier 12 by the condenser 16 operating in conjunction with the input impedance of the transistor 12 and by the frequency-selective negative feedback network, including the emitter-resistors 20 and 21 and the condenser 22. Additional rejection of audio is achieved by choke 30 which is tuned to the supersonic frequency range by the dynamic capacity of transistor 12 and other shunt capacitances. Thus, all ranges of frequency other than the supersonic ranges are rejected, and only the supersonic ranges of frequency appear in the output circuit of the transistor amplifier 12.

The noise input level required to cause squelching is adjustable within limits by means of the potentiometer 29 in the coupling circuit between transistors 11 and 12. The gain and biasing characteristics of the transistor 12 are selected so as to cause full saturation with the normal amplified receiver noise applied at the input. Potentiometer 29 may be set to a point where the current through the relay-energizing winding is just slightly more than required to open relay contacts and, thus, a small decrease of noise will close the relay contacts. This setting of the control determines the minimum sensitivity of the squelch and is reproducible since the receiver noise, in the absence of signal, is sufficient to saturate fully the collector of transistor 12 over a wide range of signal in the receiver itself. Thus, uniform operation is obtained over a wide range of input levels with an essentially constant ratio of noise input required to squelch and to unsquelch.

As illustrated by the curves in Fig. 3, the characteristics of the diodes 31 and 37 are radically different, the diodes having been selected so that the voltage of the diode 31 increases much more rapidly with increase in current than the voltage of diode 37. Under conditions of no noise, it will be noted that the diodes 31 and 37 are both provided with forward bias from the B+ supply through the large resistor 36, the positive electrodes of diodes 31 and 37 being interconnected through the very low direct current impedance of the choke 30. On receipt of noise, the bias on both diodes 31 and 37 is increased, and hence conduction through each is increased. Initially, the bias on diode 37 is such as to place the operating level of diode 31 close to, but not quite into, its high conduction area, for example, at 1.1 milliamperes. Thus, even a small increase in bias, for example, 0.4 volt, will result in a rapid change of current through diode 31.

It may be seen that increased conduction through diode 31, resulting from increased bias due to noise, produces increased conduction through the diode 37 in the emitter circuit of transistor 33, and thus the voltage across the diode 37 is increased. Since the positive electrodes of the diodes 31 and 37 are interconnected for direct currents, the increased positive voltage on diode 37 is fed back to diode 31, and thus the forward bias on diode 31 is still further increased. This action causes still greater conduction of the diode 31 and, consequently, still further positive feedback through the diode 37, thereby resulting in a very rapid "avalanche" of current through the transistor amplifiers 32 and 33 and through the windings of relay 8. Hence, a very positive action results when conditions of squelch exist, and the squelch system operates much like a switch; i.e., it changes from its no noise condition to its noise condition in a very minimum of time and without any tendency to remain in any intermediate state.

The arrangement of the diodes 31 and 37 as described has several advantages. First, the regenerative action of the diode 37 on the diode 31 is sufficient to cause very abrupt changes in the relay 8 from conditions of no conduction to full conduction, or vice versa; nevertheless, the increase in voltage on the diode 37 is very little, relative to the collector voltage of transistor 12, and hence the noise output of transistor 12 is substantially unaffected. Furthermore, the diode 37 provides a very low direct current resistance in the emitter circuit of transistor 33 so as to eliminate from this stage essentially all negative feedback which tends to make the squelch action sluggish.

While it is clear that my invention is not limited to specific circuit values, the following parameters were used in a successful working embodiment and may aid in the use of my invention by persons skilled in the art:

| | | |
|---|---|---|
| Transistor 11 | | Type 2N113 |
| Transistor 12 | | Type 2N43 |
| Transistor 32 | | Type T.I. 23 |
| Transistor 33 | | Type T.I. 22 |
| Diode 31 | | Type IN69 |
| Diode 37 | | Type SJ12 |
| Choke 30 | h | 0.1 |
| Condenser 15 | μμf | 560 |
| Condenser 16 | μf | .0033 |
| Condenser 19 | μf | .033 |
| Condenser 22 | μf | .033 |
| Condenser 39 | μf | 2 |
| Condenser 40 | μf | 12 |
| Potentiometer 29 | ohms | 2500 |
| Resistor 17 | do | 220 |
| Resistor 18 | do | 10K |
| Resistor 20 | do | 220 |
| Resistor 21 | do | 10K |
| Resistor 23 | do | 27K |
| Resistor 24 | do | 18K |
| Resistor 25 | do | 27K |
| Resistor 26 | do | 18K |
| Resistor 27 | do | 8200 |
| Resistor 28 | do | 150 |
| Resistor 34 | do | 2200 |
| Resistor 35 | do | 3300 |
| Resistor 36 | do | 68K |

From the foregoing description, many modifications and adaptations will become apparent to persons skilled in the art. For example, by conventional circuit alterations, PNP or NPN transistors may be substituted and, in appropriate circumstances, point contact transistors or vacuum tubes may also be used. Furthermore, the operation of the relay may be reversed, i.e., the relay contacts may be normally open when no noise is present and closed when noise exceeds a predetermined level, the audio signal being short-circuited in a convenient manner. Also, the squelch system need not be associated with a relay; for example, voltage obtained across the windings of the relay 8 may be used to bias the control element of an amplifier in the audio stages below cutoff. In addition, the switch 38 may be used in other locations; for example, if placed in series with potentiometer 29, the squelch is rendered inoperative if the switch is open, and the contacts of relay 8 will be maintained closed at all times. It is intended, therefore, that my invention be not limited to the specific components and circuitry shown, but should encompass all equivalents, and that the scope thereof be limited only by the appended claims as interpreted in the light of the prior art.

Having thus described a preferred embodiment of my invention, what I now claim is:

1. In a squelch circuit for a receiver of carrier waves, the combination comprising: means for deriving noise from said receiver; first amplifying means for amplifying said noise; means for adjusting said first amplifying means for maximum conduction in the absence of said carrier waves; rectifying means for converting said amplified noise into a direct voltage, said direct voltage having a predetermined magnitude in the absence of said carrier; second amplifying means for amplifying said direct voltage, said second amplifying means being biased for conduction except when said direct voltage is less than said predetermined magnitude; a load circuit for said second amplifying means; and means for regeneratively feeding back a portion of said amplified direct voltage from said load circuit to said rectifying means.

2. The invention as defined in claim 1 wherein said means for regeneratively feeding back a portion of said amplified voltage to said rectifying means comprises a variable impedance connected in said load circuit and to said rectifying means, said variable impedance having characteristics such that an increase in current therethrough causes a decrease in its impedance and an increase in voltage.

3. The invention as defined in claim 1 wherein said load circuit for said second amplifying means includes a transistor having at least base, collector and emitter electrodes, and wherein said means for regeneratively feeding back a portion of said amplified direct voltage from said load circuit to said rectifying means includes a variable impedance connected in series with said collector and emitter electrodes, said variable impedance being connected also to said rectifying means, said variable impedance having characteristics such that an increase in current therethrough produces a decrease in its impedance and an increase in voltage.

4. The invention as defined in claim 3 wherein said variable impedance comprises a unidirectional conduction device.

5. The invention as defined in claim 3 wherein said variable impedance comprises a crystal diode.

6. In a squelch circuit for use in a receiver of carrier waves modulated by signal, the combination comprising: means for deriving noise frequencies in the frequency band intermediate said signal and said carrier; a first transistor amplifier for amplifying said noise, said first transistor amplifier being operated at saturation by said noise in the absence of said carrier; forwardly biased rectifying means for converting said amplified noise into a direct current; a second transistor amplifier for amplifying said direct current, said second transistor amplifier having an input circuit and an output circuit; and a variable impedance device common to said input circuit and said output circuit, said variable impedance having a positive terminal and a negative terminal and having characteristics such that an increase in current therethrough produces a decrease in its impedance and an increase in voltage, one of said terminals being connected to said rectifying means to enhance the forward bias thereof.

7. The invention as defined in claim 6 wherein said variable impedance comprises a unidirectional conduction device.

8. The invention as defined in claim 6 wherein said variable impedance comprises a crystal diode.

9. The invention as defined in claim 6 wherein said output circuit includes the windings of a relay having contacts operatively connected in circuit with said receiver.

10. The combination comprising: a first transistor having base, emitter and collector electrodes; an input circuit between said base and emitter electrodes; an output circuit between said base and collector electrodes; a first diode rectifier connected in said input circuit; a second transistor having base, emitter and collector electrodes; said emitter of said first transistor being directly connected to the base of said second transistor; a second diode connected in series with the emitter of said second transistor; said second diode also being connected for direct currents directly to said first diode; and said second diode having characteristics such that an increase in current therethrough produces a decrease in its impedance and an increase in voltage, whereby said second diode regeneratively biases said first diode as current through said second diode increases.

References Cited in the file of this patent

UNITED STATES PATENTS

| | | |
|---|---|---|
| 2,629,834 | Trent | Feb. 24, 1953 |
| 2,724,061 | Enery | Nov. 15, 1955 |
| 2,840,699 | Carpenter | June 24, 1958 |